(12) United States Patent
Wilkie et al.

(10) Patent No.: US 9,741,922 B2
(45) Date of Patent: Aug. 22, 2017

(54) SELF-LATCHING PIEZOCOMPOSITE ACTUATOR

(71) Applicant: The United States of America as represented by the Administrator of the National Aeronautics and Space Administration, Washington, DC (US)

(72) Inventors: William K. Wilkie, Williamsburg, VA (US); Robert G. Bryant, Williamsburg, VA (US); Christopher S. Lynch, Sherman Oaks, CA (US)

(73) Assignee: THE UNITED STATES OF AMERICA AS REPRESENTED BY THE ADMINISTRATOR OF THE NATIONAL AERONAUTICS AND SPACE ADMINISTRATION, Washington, DC (US)

( * ) Notice: Subject to any disclaimer, the term of this patent is extended or adjusted under 35 U.S.C. 154(b) by 276 days.

(21) Appl. No.: 14/571,823

(22) Filed: Dec. 16, 2014

(65) Prior Publication Data
US 2016/0233410 A1 Aug. 11, 2016

Related U.S. Application Data

(60) Provisional application No. 61/916,432, filed on Dec. 16, 2013.

(51) Int. Cl.
*H01L 41/09* (2006.01)
*H01L 41/08* (2006.01)
(Continued)

(52) U.S. Cl.
CPC ............... *H01L 41/09* (2013.01); *B64C 3/48* (2013.01); *B64C 27/72* (2013.01); *F02C 7/042* (2013.01);
(Continued)

(58) Field of Classification Search
CPC .................. H01L 41/09082; H01L 41/18
(Continued)

(56) References Cited

U.S. PATENT DOCUMENTS 4,250,603 A   2/1981 Luft
4,479,069 A   10/1984 Miller
(Continued)

OTHER PUBLICATIONS

Wilkie, William K. et al., "Self-Latching Shape Memory Piezocomposite Control Surface," NASA Aeronautics Research Mission Directorate, FY12 Seedling Phase I Technical Seminar, Jul. 9-11, 2013.
(Continued)

*Primary Examiner* — Shawki S Ismail
*Assistant Examiner* — Muhammad S Islam
(74) *Attorney, Agent, or Firm* — Andrea Z. Warmbier

(57) ABSTRACT

A self-latching piezocomposite actuator includes a plurality of shape memory ceramic fibers. The actuator can be latched by applying an electrical field to the shape memory ceramic fibers. The actuator remains in a latched state/shape after the electrical field is no longer present. A reverse polarity electric field may be applied to reset the actuator to its unlatched state/shape. Applied electric fields may be utilized to provide a plurality of latch states between the latched and unlatched states of the actuator. The self-latching piezocomposite actuator can be used for active/adaptive airfoils having variable camber, trim tabs, active/deformable engine inlets, adaptive or adjustable vortex generators, active optical components such as mirrors that change shapes, and other morphing structures.

20 Claims, 12 Drawing Sheets

(51) Int. Cl.
  *B64C 3/48* (2006.01)
  *B64C 27/72* (2006.01)
  *F02C 7/042* (2006.01)
  *G02B 26/08* (2006.01)

(52) U.S. Cl.
  CPC ........ *G02B 26/0858* (2013.01); *H01L 41/082* (2013.01); *B64C 2027/7211* (2013.01); *F05D 2260/407* (2013.01); *F05D 2300/603* (2013.01); *Y02T 50/672* (2013.01)

(58) Field of Classification Search
  USPC .................................................. 310/328, 800
  See application file for complete search history.

(56) References Cited

U.S. PATENT DOCUMENTS

| | | | |
|---|---|---|---|
| 4,613,784 A | 9/1986 | Haun et al. | |
| 4,747,192 A | 5/1988 | Rokurota | |
| 4,939,826 A | 7/1990 | Shoup | |
| 5,225,731 A * | 7/1993 | Owen | H01L 41/092 310/357 |
| 5,239,736 A | 8/1993 | Sliwa, Jr. et al. | |
| 5,340,510 A | 8/1994 | Bowen | |
| 5,440,193 A * | 8/1995 | Barrett | B64C 13/50 156/291 |
| 5,527,480 A | 6/1996 | Bailey et al. | |
| 5,539,965 A | 7/1996 | Safari et al. | |
| 5,645,753 A | 7/1997 | Fukuoka et al. | |
| 5,656,882 A | 8/1997 | Lazarus et al. | |
| 5,662,294 A * | 9/1997 | Maclean | B63B 1/28 114/140 |
| 5,687,462 A | 11/1997 | Lazarus et al. | |
| 5,692,279 A | 12/1997 | Mang et al. | |
| 5,702,629 A | 12/1997 | Cui et al. | |
| 5,849,125 A | 12/1998 | Clark | |
| 5,860,202 A | 1/1999 | Okawa et al. | |
| 5,869,189 A | 2/1999 | Hagood, IV et al. | |
| 5,874,868 A | 2/1999 | Shimoe | |
| 5,977,691 A | 11/1999 | Stephens et al. | |
| 6,038,752 A | 3/2000 | Finsterwald et al. | |
| 6,043,588 A | 3/2000 | Tabota et al. | |
| 6,048,622 A | 4/2000 | Hagood, IV et al. | |
| 6,069,433 A | 5/2000 | Lazarus et al. | |
| 6,088,894 A | 7/2000 | Oakley et al. | |
| 6,255,761 B1 | 7/2001 | Benjamin | |
| 6,404,107 B1 * | 6/2002 | Lazarus | H02N 2/021 310/323.17 |
| 6,489,706 B2 | 12/2002 | Sliwa, Jr. et al. | |
| 6,629,341 B2 | 10/2003 | Wilkie et al. | |
| 2003/0056351 A1 * | 3/2003 | Wilkie | H01L 41/082 29/25.35 |
| 2003/0155842 A1 * | 8/2003 | Hobelsberger | H02N 2/163 310/331 |
| 2006/0279178 A1 * | 12/2006 | Ren | H01L 41/18 310/358 |
| 2007/0205332 A1 * | 9/2007 | Mercier Des Rochettes | B64C 27/001 244/219 |
| 2008/0297005 A1 * | 12/2008 | Sakashita | B41J 2/14233 310/330 |
| 2013/0038335 A1 * | 2/2013 | Hori | H01H 57/00 324/537 |

OTHER PUBLICATIONS

N. Hagood et al , "Improving Transverse Actuation of Piezoceramics Using Interdigitated Surface Electrodes," 1993, SPIE, Smart Structures and Intelligent Sysmtes, pp. 341-352, vol. 1917.

Bent, Aaron A. et al., "Anisotropic Actuation With Piezoelectric Fiber Composites," J. of Intelligent Material Systems and Structures, May 1995, pp. 338-349, vol. 6.

Bent, Aaron A. et al., "Active Fiber Composites for Structural Actuation," Jan. 1997, 209 pages.

Wilkie, W. Keats et al., "Low-Cost Piezocomposite Actuator for Structural Control Applications," Smart Structures and Materials, 2000: Industrial and Commercial Applications of Smart Structures Technologies, Proceedings of SPIE, 2000, pp. 323-334, vol. 3991.

Janos, Benon Z. et al., "Magnetic Particle Doping for Anistropic Matrix Materials in Active Fiber Composites," SPIE, Smart Materials Technologies, Mar. 1999, pp. 10-21, vol. 3675, Newport Beach, CA.

Hagood, N. W. et al., "Development of Piezoeletric Fiber Composites for Structural Actuation," Proceedings of the 34th AIAA Structures, Structural Dynamics and Materials Conference, 1993, pp. 3625-3638, AIAA 93-1717-CP, LaJolla, CA.

MIDE Technology Corporation, Product Information Sheet, Flexible Piezoelectric Technology, Aug. 1999, 2 pages.

Bent, Aaron A., "Active Fiber Composite Material Systems for Structural Control Applications," SPIE, Industrial and Commercial Applications of Smart Structures Technologies, Mar. 2-4, 1999, pp. 166-177, vol. 3674, Newport Beach, CA.

Bent, Aaron A. et al., "Improved Performance in Piezoelectric Fiber Composites Using Interdigitated Electrodes," SPIE, Feb. 27-28, 1995, pp. 196-212, vol. 2441, San Diego, CA.

Rodgers, John P. et al., "Characterization of Interdigitated Electrode Piezoelectric Fiber Composites Under High Electrical and Mechanical Loading," SPIE, Feb. 26-29, 1996, pp. 642-659, vol. 2717, San Diego CA.

* cited by examiner

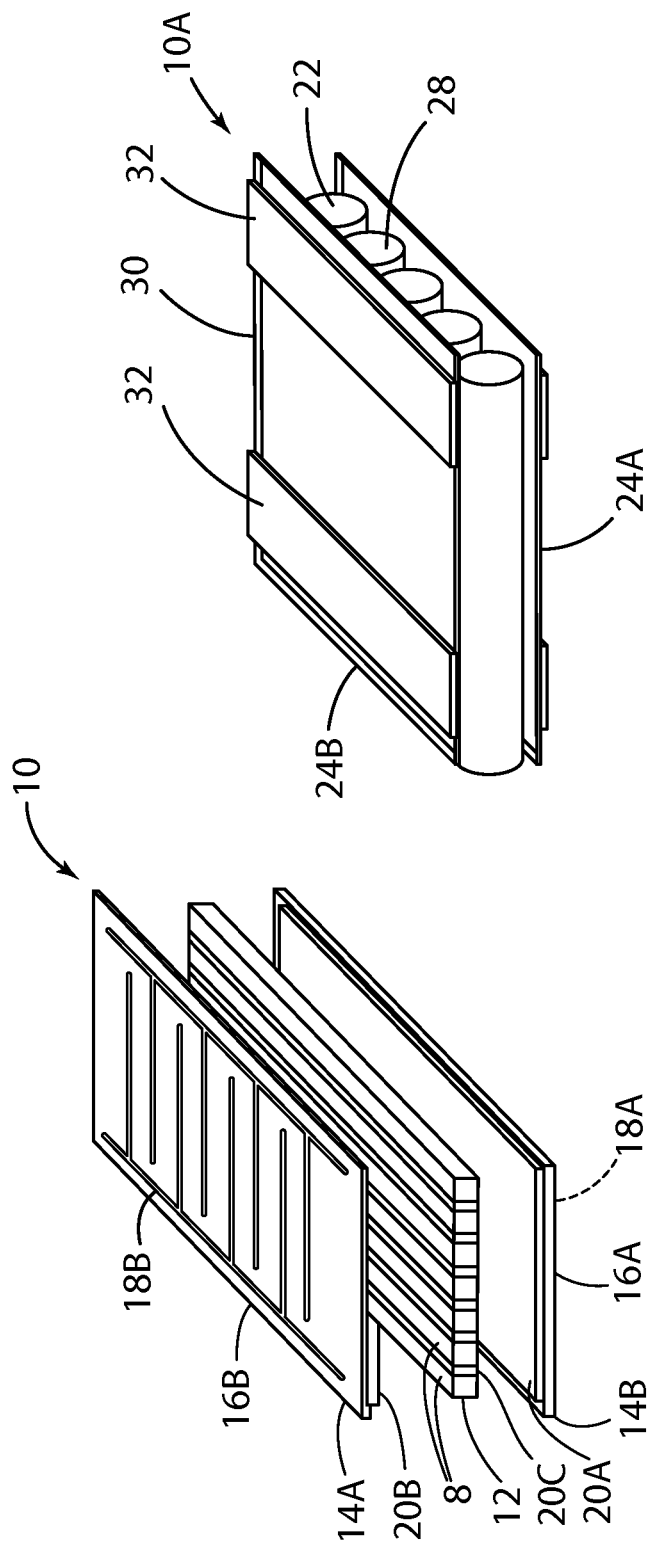

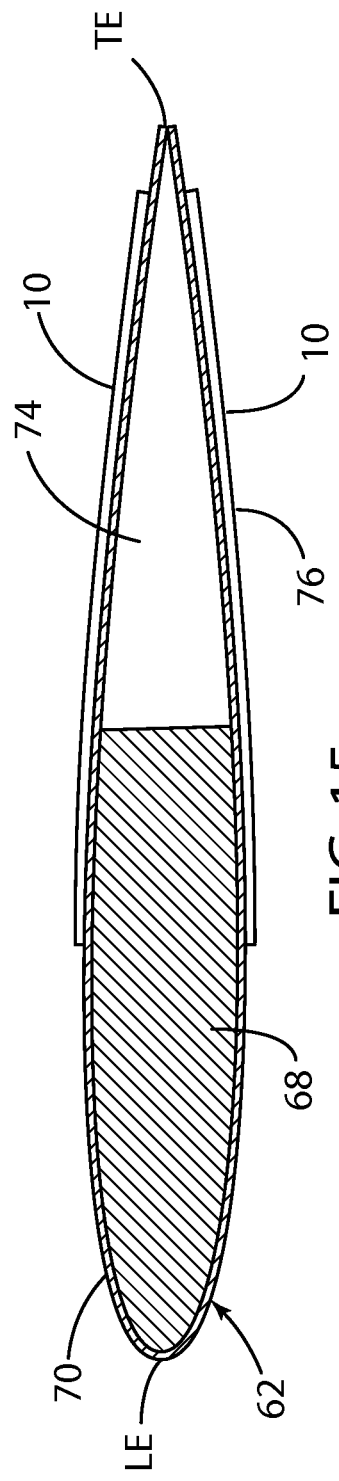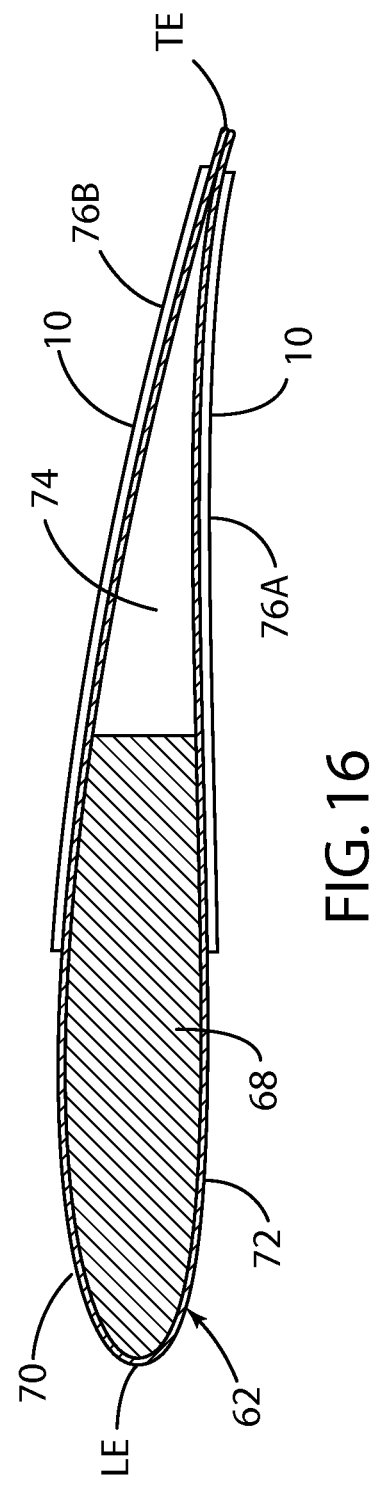

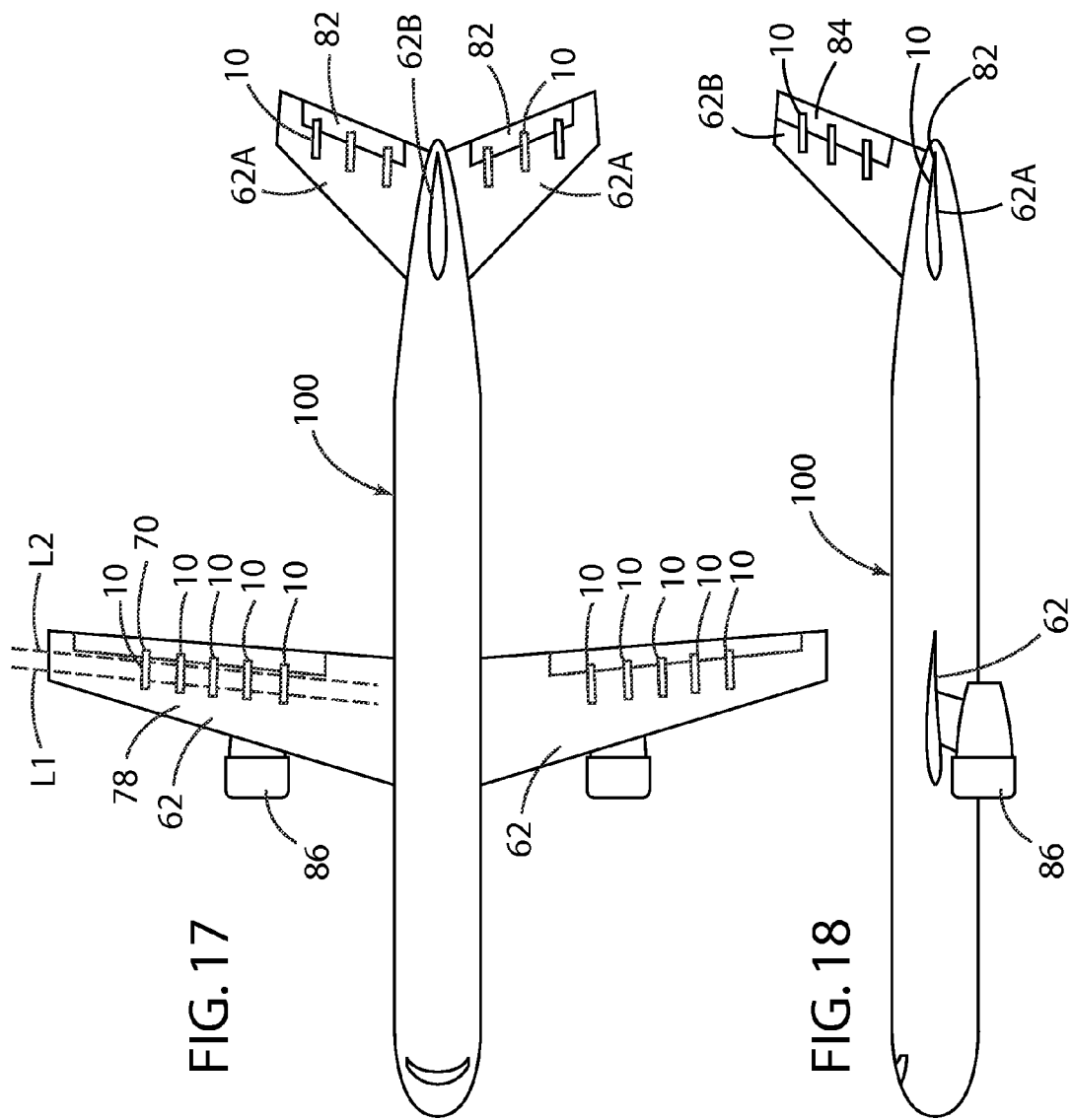

SELF-LATCHING PIEZOCOMPOSITE ACTUATOR

CROSS-REFERENCE TO RELATED PATENT APPLICATION

This patent application claims the benefit of and priority to U.S. Provisional Patent Application No. 61/916,432, titled "SELF-LATCHING PIEZOCOMPOSITE ACTUATOR," filed on Dec. 16, 2013, the contents of which are hereby incorporated by reference in their entirety. The present application is also related to U.S. Pat. No. 6,629,341, titled "METHOD OF FABRICATING A PIEZOELECTRIC COMPOSITE APPARATUS," the entire contents of which are incorporated by reference.

STATEMENT REGARDING FEDERALLY SPONSORED RESEARCH OR DEVELOPMENT

The invention described herein was made in the performance of work under a NASA contract and by employees of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the contractor elected not to retain title.

BACKGROUND OF THE INVENTION

Piezoelectric actuators typically require constant control and management of electric fields to set and hold deflections. Without constant application of the controlling electrical field, for example, in the event of a power failure, the piezoelectric actuator will return to a neutral or near-neutral deflection state. For quasistatic deflection or shape control applications, electrical efficiency and fault tolerance of the piezoelectric system (integrated structure, actuators, and controls) could be improved by eliminating the need to maintain electrical power and active control on the piezoelectric actuator components once a desired deflection is achieved.

SUMMARY OF THE INVENTION

One aspect of the present invention is a device that manipulates the remnant strain behavior present in certain ferroelectric ceramics to set or adjust quasistatic extensional or flexural deflections in a composite structure without the application of a persistent controlling electrical field. Potential aeronautics applications include adaptive-camber airfoils, trim tabs, deformable engine inlets, and adaptive or adjustable vortex generators. Space applications include active optics and reflector systems.

One aspect of the present invention is a method of controlling a self-latching piezocomposite actuator having a layer of shape memory ceramic fibers and first and second layers that include conductive patterns. The first and second layers are disposed on opposite sides of the layer of shape memory ceramic fibers. The method includes causing the shape memory ceramic fibers to have a first strain state by at least partially poling the shape memory ceramic fibers utilizing a first electric field that is induced by causing a voltage difference in the conductive patterns of the first and second layers. The method farther includes removing the voltage difference whereby the shape memory ceramic fibers remain in the first strain state. The shape memory ceramic fibers are then at least partially de-poled utilizing a second electric field having a polarity that is substantially opposite a polarity of the first electric field to thereby cause the shape memory ceramic fibers to have a second strain state that is not equal to the first strain state.

Another aspect of the present invention is a method of controlling the shape of a structure that is capable of defining at least first and second shapes. The method includes providing a self-latching piezocomposite actuator comprising a plurality of aligned shape memory ceramic fibers defining first and second strained states. The self-latching piezocomposite actuator is operably connected to the structure. The strain state of the shape memory ceramic fibers is changed from the first strain state to a second strain state by applying a first electric field to the shape memory ceramic fibers such that the shape of the structure changes from the first shape to the second shape. The first electrical field is removed after the fibers are in the second strain state, and wherein the actuator continues to maintain the structure in the second shape after the first electrical field is removed. A second electrical field is then applied to the shape memory ceramic fibers to cause the shape memory ceramic fibers to change from the second strain state to a third strain state that is between the first and second strain states or equal to the first strain state. The structure defines a third shape corresponding to the third strain state that is between the first and second shapes or is the same as the first shape. The structure is maintained in the third shape after the second electrical field is removed whereby the shape memory ceramic fibers of the actuator are maintained in the third strain state.

Another aspect of the present invention is a method of controlling a self-latching piezocomposite actuator. The method includes providing a self-latching piezocomposite actuator comprising a plurality of aligned shape memory ceramic fibers defining first and second strain states and a plurality of intermediate strain states between the first and second strain states. The method includes determining a required intermediate strain state of the shape memory ceramic fibers corresponding to a required shape of a structure incorporating the actuator. The method further includes determining a present strain state of the shape memory ceramic fibers, and changing the strain state of the shape memory ceramic fibers from the present strain state to the required intermediate strain state by applying an electrical field to the shape memory ceramic fibers. The electrical field is removed after the fibers are in the required strain state, and the shape memory ceramic fibers remain in the required strain state.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

FIG. 1 is an exploded isometric view of a self-latching piezocomposite actuator according to one aspect of the present invention;

FIG. 2 is an isometric view of a self-latching piezocomposite actuator according to another aspect of the present invention;

FIG. 15 is a partially schematic cross sectional view of the wing of FIGS. 12-14 wherein the actuators are in an unlatched state;

FIG. 16 is a partially schematic cross sectional view of the wing of FIGS. 12-14 wherein the actuators are in a latched state to increase the camber of the wing;

FIG. 17 is a partially schematic plan view of an aircraft including self-latching actuators and aerodynamic surfaces that change shape upon actuation of the self latching piezocomposite actuator;

FIG. 18 is a side elevational view of the aircraft of FIG. 17; and

DETAILED DESCRIPTION OF THE INVENTION

Figure 3:
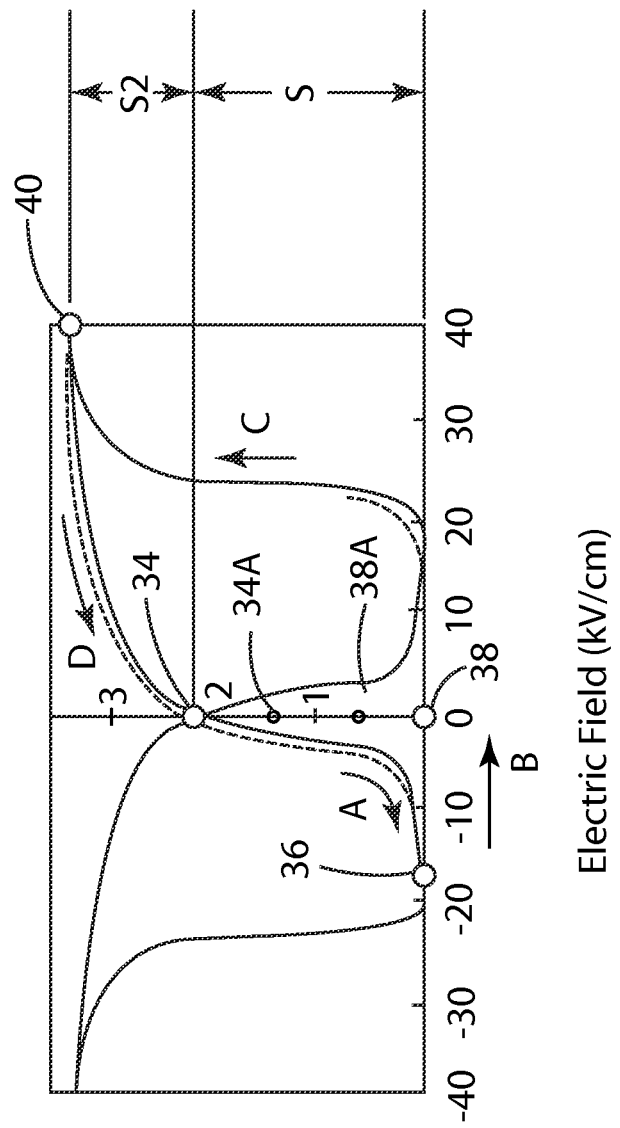
FIG. 3 is a graph showing field-induced strain curves for a shape memory ceramic material that switches from an antiferroelectric to a ferroelectric state.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

With reference to FIG. 1, a self-latching piezocomposite actuator 10 according to one aspect of the present invention includes a first sheet 12 and second sheets 14A and 14B. The first sheet 12 comprises machined piezoceramic fibers 8 having rectangular cross sectional shapes, and the second sheets 14A and 14B comprise polyimide films 16A and 16B having interdigitated electrodes 18A and 18B. Structural epoxy matrix material 20A and 20B is disposed between the first sheet 12 and the second sheets 14A and 14B. Epoxy matrix material 20C is also disposed between the piezoceramic fibers 8 of first sheet 12. The actuator 10 may be fabricated utilizing the processes described in U.S. Pat. No. 6,629,341.

A piezocomposite actuator 10A according to another aspect of the present invention includes a first sheet or layer 22 including a plurality of cylindrical piezoceramic fibers 28, and second sheets 24A and 24R that comprise epoxy material 30 and electrodes 32.

The fibers 8 (FIG. 1) and fibers 28 (FIG. 2) comprise a shape memory ceramic material. The shape memory ceramic material of fibers 8 and 28 changes shape when an electrical field is applied to the shape memory ceramic material, and the shape memory ceramic material remains in the changed shape even after the electrical field is no longer applied. A reverse electrical field can then be applied to return the shape memory ceramic to its initial state/shape. Fibers 8 and 28 may comprise a PZT 5H material defining a d33 mode along the fibers whereby the fibers increase in length when actuated. The electrical fields can be selectively applied utilizing the interdigitated electrodes 18A and 18B to cause the actuator 10 to curve or bend due to increasing strain on one side of fibers 8 while simultaneously decreasing strain of the material of fibers 8 along an opposite side of first sheet 12. Alternatively, the overall lengths of the fibers 8 may be increased and decreased by inducing substantially uniform strain states on opposite sides of fibers 8 by controlling the electrical fields generated as a result of electrical current traveling through the electrodes 18A and 18B.

With further reference to FIG. 3, a shape memory ceramic material such as a lead zirconate stannate based Pb0.99Nb0.02((ZrxSn1-x)1-yTiy)0.98O3 system exhibits shape memory characteristics. The material begins at an unlatched state 34 wherein no electrical power (electric field) is applied to the material. If an electric field is applied to the material, the state of the material travels from the unlatched state 34 to an unpoling state 36 as shown by the arrow "A." When the electric field is removed, the state of the material changes from the unpoling state 36 to the power-off, latched state 38 as shown by the arrow "B." Significantly, the strain of the material changes in magnitude as shown by the dimension "S," and the material remains in the power-off latched strain state. If a reverse electric field is applied, the state of the material changes from the power-off latched state 38 to the re-poling reset state 40 as shown by the arrow "C." When the reverse electric field is removed, the material changes from the re-poling reset state 40 back to the original unlatched state 34 as shown by the arrow "D," thereby causing a change in the magnitude of the strain as shown by the dimension "S2." The shape memory ceramic fibers 8 and/or 28 comprise various a shape memory ceramic materials having field-induced strain characteristics. It will be understood that FIG. 3 provides an example of a shape memory material, but the present invention is not limited to this specific material. As discussed in more detail below in connection with FIGS. 8-12, the fibers 8 and 28 may also comprise other types of shape memory ceramic materials.

The actuators 10 and 10A may be either partially or fully unlatched as required. Referring again to FIG. 3, if the piezoelectric ceramic material is in a latched state 38, and if a weaker (i.e. between 0 and 40 kV/cm) reverse electric field is applied, the material will not change all the way to the re-poling reset state 40 when the reverse electric field is removed, and the ceramic material will instead return to a strain state 34A that is between the unlatched state 34 and the power-off latched state 38. Also, when the material is at the power-off unlatched state, a weaker electric field (i.e. between −20 and 0 kV/cm) can be applied and removed to shift the material to a power-off latched state 38A that is between the power-off latched state 38 and the power-off unlatched state 34. Thus, by controlling the electric field applied to the fibers 8 of actuator 10, the actuator 10 can take on different states between the unlatched state 34 and the latched state 38 as required for a particular operating condition or application.

Referring again to FIGS. 1 and 2, the characteristics of the piezocomposite actuators 10 and 10A may be selected as required for a particular application. As discussed above, the fibers 8 and/or 28 may be fabricated such that the d33 mode extends along the fibers, whereby the fibers decrease in length when changing from the power-off unlatched state 34 (FIG. 3) to the power-off latched state 38. Conversely, the fibers 8 and/or 28 may be fabricated with the d31 mode extending along the length of the fibers whereby the fibers increase in length when shifting from a power-off unlatched state to a power-off latched state. Accordingly, it will be understood that the strain states (e.g. FIG. 3) depend on the material selected, and the orientation of the mode of the fibers 8 and/or 28.

Figure 5:
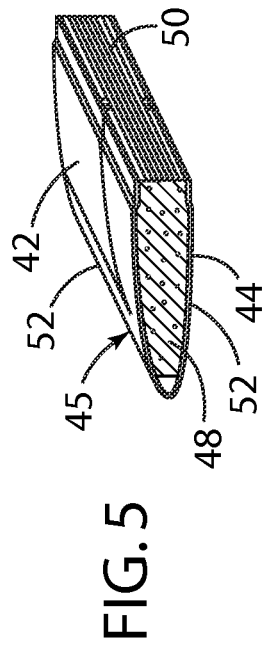
FIG. 5 is a partially fragmentary isometric view of a portion of a helicopter rotor having active twist control according to another aspect of the present invention.
Figure 4:
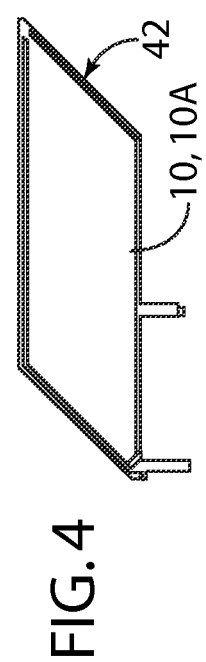
FIG. 4 is partially schematic isometric view of active fiber composite plies that may be utilized in constructing an active structure accordingly to one aspect of the present invention.
Figure 6:
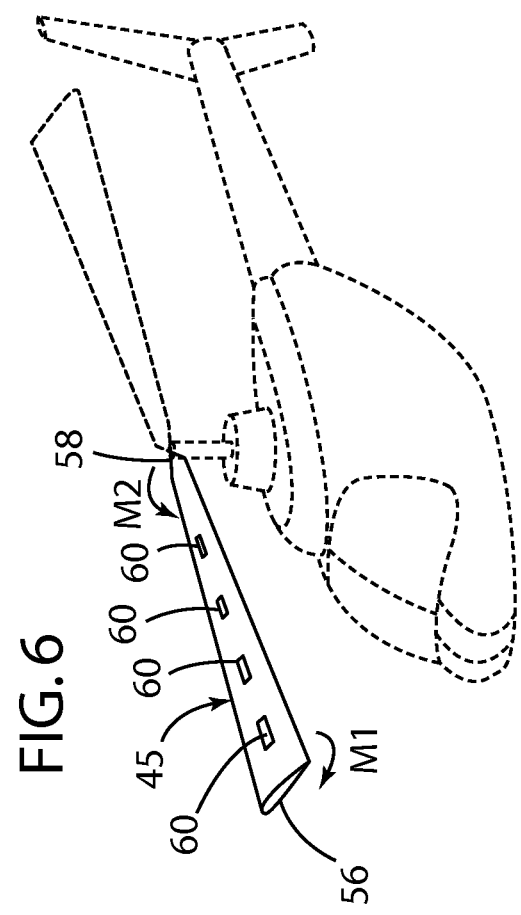
FIG. 6 is a partially schematic isometric view of a helicopter rotor having active blade twist control for vibration reduction according to another aspect of the present invention.

With further reference to FIG. 4, the actuators 10 and 10A of FIGS. 1 and 2, respectively, may be utilized to form active fiber composite plies 42 by incorporating the actuators into conventional fiber composite plies. With further reference to FIGS. 5 and 6, a helicopter rotor blade 45 includes conventional fiber composite laminates 44, and may include a core 48 comprising foam or other lightweight material. The fiber composite laminate 44 may comprise known materials such as carbon fibers and an epoxy matrix or other suitable materials. The active fiber plies 42 are disposed over at least a portion of the fiber composite laminate 44. A flex circuit 50 extends between the upper side 52 of rotor blade 45 and lower side 54 of rotor blade 45. An optional flex circuit 50 comprises piezoelectric material elements whereby the flex circuit 50 generates electricity as rotor blade 45 flexes. The electrical current from the flex circuit 50 may be applied to the actuator 10 of active fiber composite ply 42 to thereby latch and/or unlatch the actuator 10 to control the shape of the rotor blade 45. It will be understood that the electrical power supplied to the active fiber composite plies 42 may come from a battery or other suitable electrical power source rather than flex circuit 50.

With further reference to FIG. 6, in use aerodynamic forces acting on rotor blade 45 generate a first moment "M1." In FIG. 6, the moment M1 is shown as acting at end 56 of rotor blade 45. However, it will be understood that the moment M1 actually acts along the length of the blade 45 due to the aerodynamic forces acting on the rotor blade 45. A counter acting moment "M2" at base end 58 of rotor blade 45 results from moment M1. Actuators 10 (or 10A) and/or active fiber composite plies 42 can be oriented such that actuation of the actuators 10 generates threes within active fiber composite plies 42 tending to counteract the twist resulting from the applied moments M1 and M2. Furthermore, the shape of rotor blade 45 can be varied utilizing actuators 10 to provide a desired rotor shape in use that optimizes lift, reduces noise, and/or provides other results as required for a particular application.

The magnitude of the moments M1 and M2 may be related to helicopter operating conditions. For example, when the rotor blade 45 experiences a relatively large aerodynamic force, the moments M1 and M2 may tend to be larger. The amount of electric current and resulting electric field that is applied to the actuator 10 can be varied as required to compensate for the variation in the applied moment M1. For example, a plurality of strain sensors 60 may be imbedded in the fiber composite laminate 44 and/or the active fiber 42 on the upper side 52 and/or lower side 54 of rotor blade 45. The strain data from strain sensors 60 may be utilized by a controller (not shown) to determine the magnitude of an electrical field to be applied to the actuator 10. Referring again to FIG. 3, in the illustrated example, if an electric field of less than −20 kV/cm is applied to the fibers, the magnitude of the change in strain will be less than "S." Thus, a variable electric field can be applied to the actuators 10 of rotor 45 (FIGS. 4-6) to thereby control the twist of the rotor 45 as required for a particular operating condition.

Figure 7:
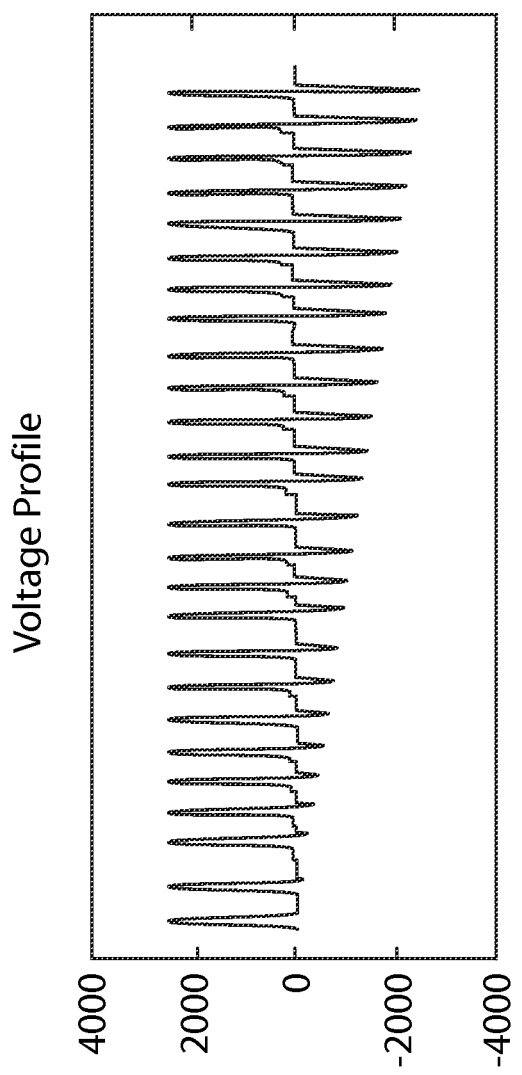
FIG. 7 is a graph showing voltage that can be applied to a self-latching piezocomposite actuator to control remnant strain by partial poling/de-poling of the shape memory material.
Figure 10:
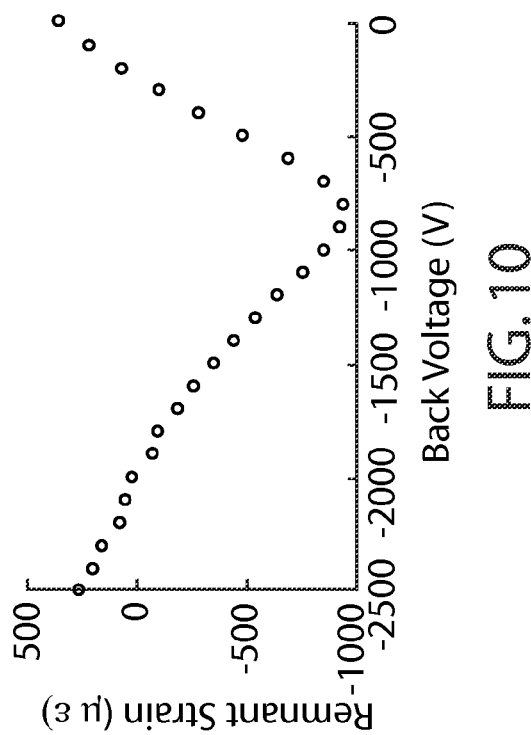
FIG. 10 is a graph showing remnant strain versus hack voltage.
Figure 8:
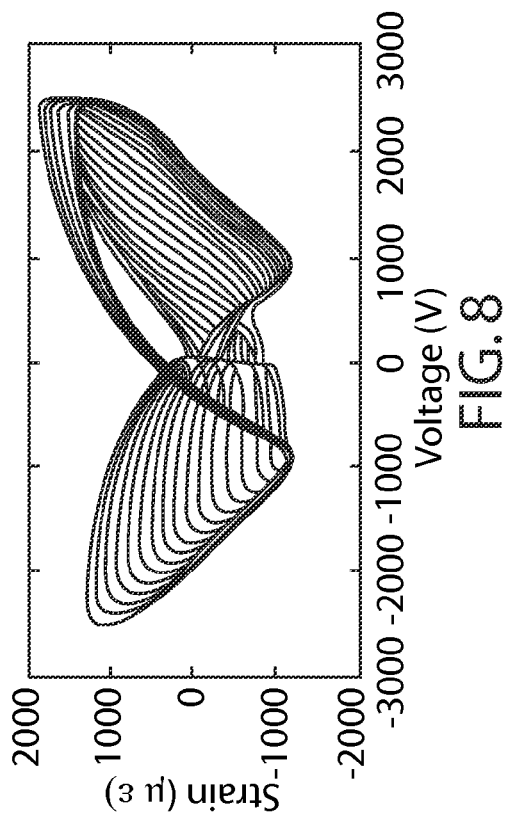
FIG. 8 is a graph showing longitudinal strain versus voltage.
Figure 9:
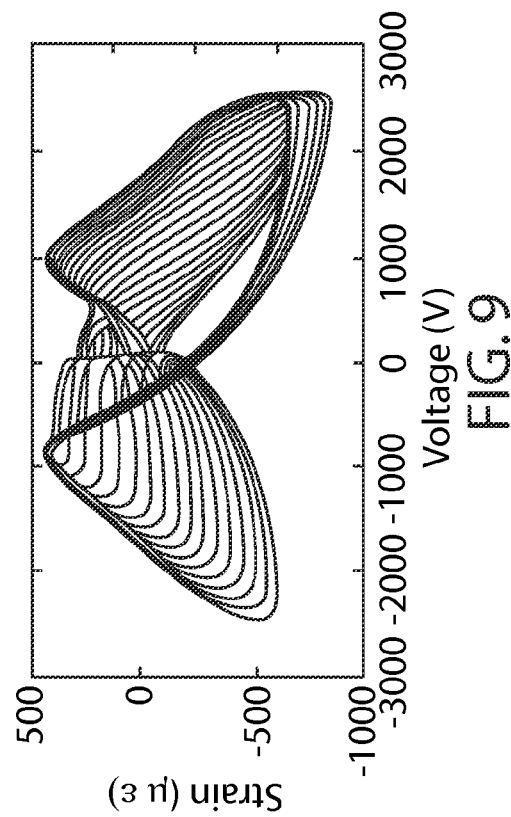
FIG. 9 is a graph showing longitudinal transverse strain versus voltage.

With further reference to FIG. 7, positive and negative voltages can be applied to the shape memory ceramic fibers 8. FIGS. 8-10 show the strain versus voltage characteristics of a PZT-5H shape memory ceramic material resulting from the voltages of FIG. 7. Specifically, application of the voltages of FIG. 7 results in longitudinal strain as shown in FIG. 8, and transverse strain as shown in FIG. 9. As shown in FIG. 10, weaker back field voltages (i.e. weaker negative voltages in FIG. 7) cause partial depoling which reduces remnant strain. However, as the back (negative) voltage is increased, the material re-poles and remnant strain increases as also shown in FIG. 10.

Figure 11:
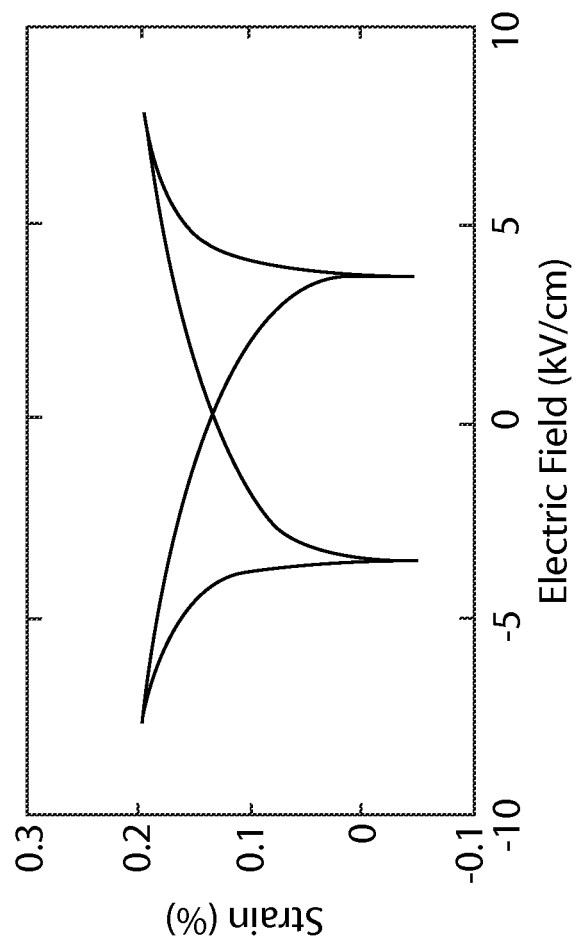
FIG. 11 is a graph showing strain versus electric field for a 8/65/35 PLZT shape memory material according to another aspect of the present invention.
Figure 12:
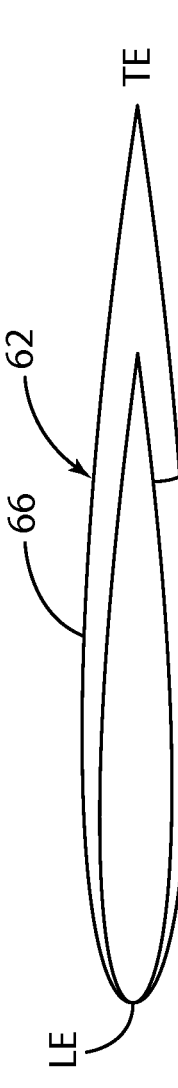
FIG. 12 is a partially schematic end view of a wing having a variable camber according to another aspect of the present invention.

With further reference to FIG. 11, a 8/65/35 PLZT material also exhibits self-latching characteristics. It will be understood that various shape memory ceramic materials may be utilized to form a self-latching piezocomposite actuator 10 according to the present invention.

Figure 13:
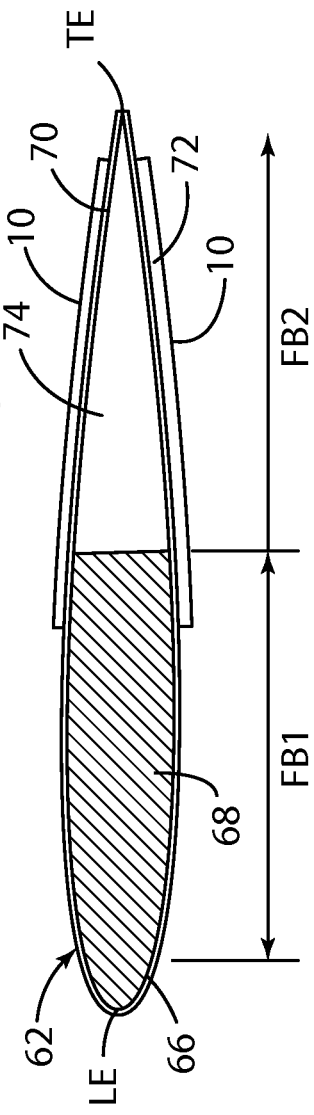
FIG. 13 is a partially schematic cross sectional view showing the root of the wing of FIG. 12.

With further reference to FIGS. 12-16, an aircraft wing 62 defines a tip profile 64 (FIG. 14) and a root profile 66 (FIG. 13). Wing 62 also includes an internal spar structure 68, an upper layer or sheet of material 70, and a lower layer or sheet of material 72. The layers/sheets 70 and 72 extend over the spar structure 68 from a leading edge "LE" of wing 62 to a trailing edge "TE" of wing 62. The spar structure 68 is substantially rigid and defines a region having a fixed boundary "FB1" The upper and lower layers/sheets 70 and 72, respectively, are connected to the spar structure 68 in the fixed boundary region FB1 such that the sheets 70 and 72 do not change shape in the fixed boundary region FB1. An internal space 74 is defined between the upper and lower sheets 70 and 72 in a free boundary region "FB2" of wing 62. The internal space 74 may be substantially empty, or it may comprise a flexible and/or compressible lightweight filler material. The layers/sheets 70 and 72 are at least somewhat flexible and capable of changing shape in the free boundary region FB2 of wing 62.

A plurality of self-latching piezocomposite actuators 10 are disposed on or incorporated into, the upper and lower layers/sheets 70 and/or 72 in the free boundary region FB2 of wing 62. It will be understood that the thickness of the actuators 10 is exaggerated in FIGS. 13-16 for purposes of showing the location of the actuators 10. Sheets 70 and/or 72 may comprise carbon fiber/epoxy matrix material, and the actuators 10 may adhesively attached to inner or outer surfaces of the layers/sheets 70, 72, or the actuators 10 may be embedded in the composite material. If the layers/sheets 70, 72 comprise metal, the actuators 10 may be adhesively bonded to the inner or outer surfaces of the layers/sheets 70, 72.

A shape-changing/morphing flexible region 76 is defined between lines "L1" and "L2." Actuators 10 may be configured to span across the region. 76 such that first ends 78 of actuators 10 are positioned in front of the line L1, and second ends 80 of actuators 10 are positioned to the rear of the line L2. In use, the actuators 10 on the upper and/or lower sides of wing 62 can be actuated to thereby vary the camber of the wing 62 in the free boundary region FB2 to change the lift generated by the wing 62 as required for a particular operating condition. For example, lower sheet 72 may flex from the shape of FIG. 15 to the shape of FIG. 16 to provide increased concave curvature 76A (FIG. 16), and the upper sheet 70 may flex to provide increased convex curvature 76B (FIG. 16). By increasing the camber, the lift of the wing can be increased for takeoff and landing, and to provide increased lift if the aircraft is carrying a heavy cargo and/or has a relatively low airspeed. Conversely, the camber can be decreased to reduce lift and drag if the aircraft loading and/or flight conditions do not require increased lift.

The actuators 10 may be actuated simultaneously or separately as required to provide a desired camber to optimize the lift of the wing 62 for a given flight condition/lift requirement. As discussed above, actuators 10 may be configured to shift from a flat (unlatched) configuration to a curved (latched) configuration. Actuators 10 on (or in) lower sheet 72 may be actuated to form a concave outer surface contour at the same time the actuators 10 on (or in) upper sheet 72 are actuated to provide increased convex curvature. By selectively actuating the actuators 10 to varying degrees (e.g. corresponding to strain states at or between unlatched state 34 and power-off latch state 38 of FIG. 3) various camber and resulting lift/drag characteristics can be provided.

Figure 14:
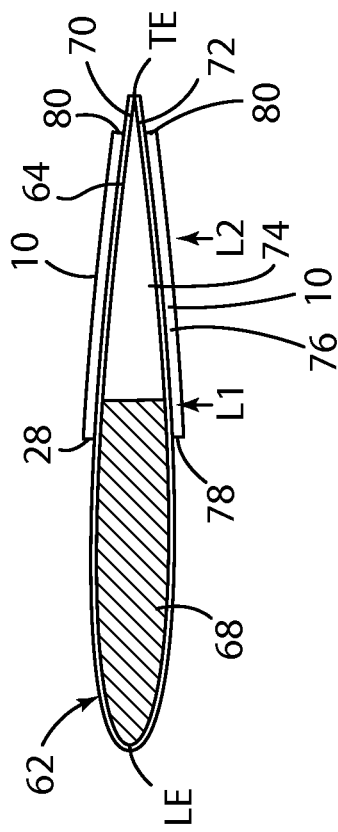
FIG. 14 is a partially schematic cross sectional view showing the tip of the wing of FIG. 13.

Self-latching actuators 10 according to the present invention may be utilized in other types of active/morphing wing structures in addition to the active/variable camber wing 62 of FIGS. 13-15. For example, the self-latching actuators of the present invention may be utilized to provide an active leading wing edge that changes shape to prevent stalling when the wing is at a high angle of attack during takeoff and/or landing operations. Self-latching actuators may also be utilized to change the shape of the wing from a conventional airfoil to a supercritical airfoil to reduce the formation of shock waves at the surface of the wing during transonic flight conditions.

With further reference to FIGS. 17 and 18, an aircraft 100 may include wings 62 having variable camber and/or other morphing features as discussed above in connection with FIGS. 12-16. Horizontal stabilizers 62A of aircraft 100 may include elevators or other control surfaces that are controlled utilizing one or more self/latching piezocomposite actuators 10 according to the present invention. Similarly, aircraft 100 may include a vertical stabilizer 62B having a rudder 84 that can be controlled utilizing actuators 10 on opposite sides of the rudder 84. Self-latching actuators 10 may be utilized in connection with flexible aerodynamic surfaces to provide integrated elevators and/or flaps to thereby eliminate the gaps between the flaps and the primary wine structures that are formed by conventional control surfaces such as flaps.

Figure 19:
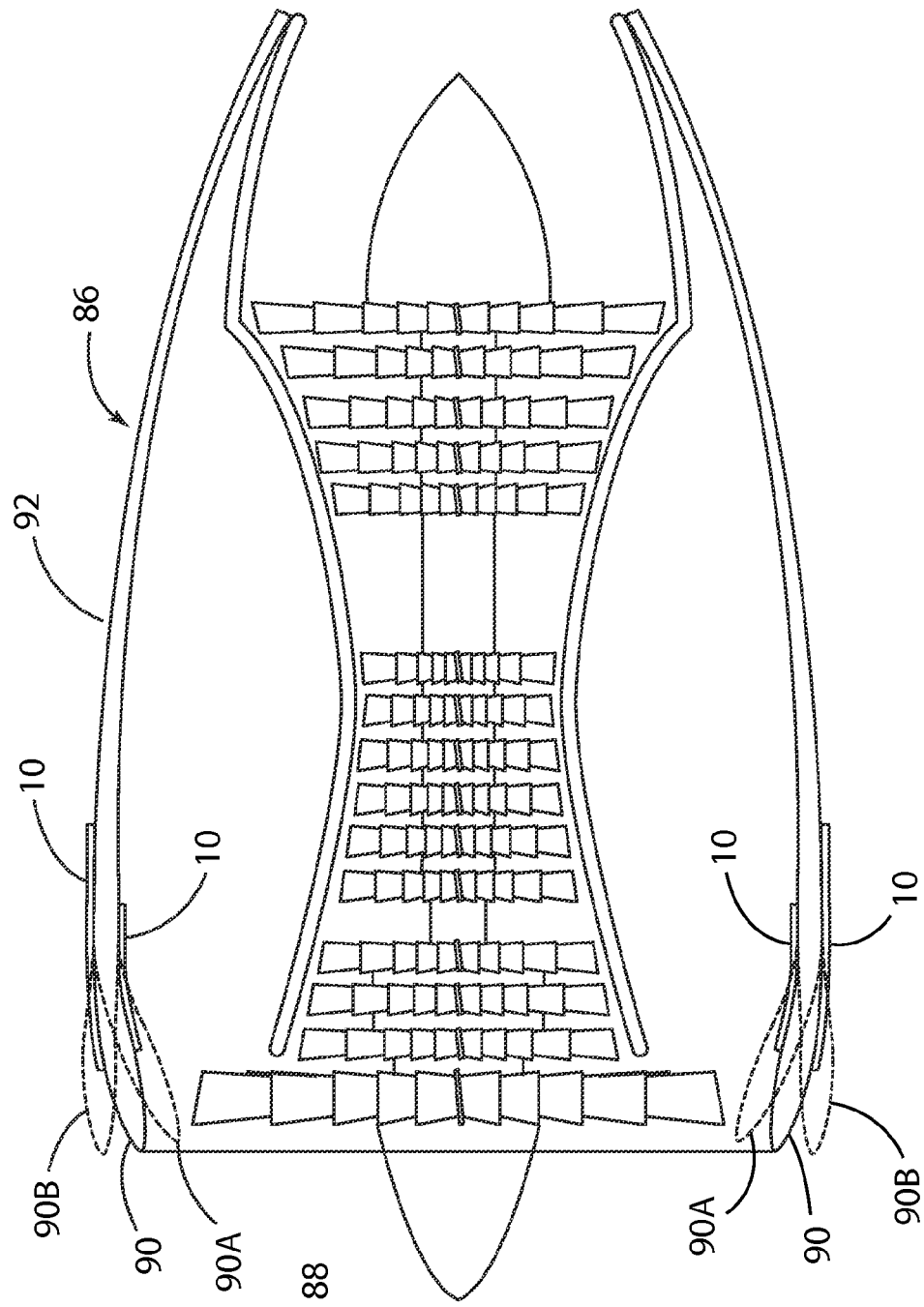
FIG. 19 is a partially schematic cross sectional view of an aircraft engine having self-latching piezocomposite actuators that change the shape of the inlet of the engine.

Aircraft 100 may also include one or more turbo fan or turbo jet engines 86 that provide thrust. With further reference to FIG. 19, engine 86 includes an inlet 88 that is defined by a forward portion 90 of engine nacelle structure 92. Actuators 10 may be incorporated into engine structure 92 adjacent forward portion 90 to thereby change the shape of forward portion 90 to increase or decrease the size and shape of inlet 88. For example, actuators 10 may be actuated to shift the forward portion 90 inwardly as shown by the dashed line 90A, or outwardly as shown by the dashed line 90B. It will be understood that the dashed lines 90A and 90B represent exaggerated movement/shape change for purposes of illustrating changes to the size and/or shape of the inlet 88.

Figure 20:
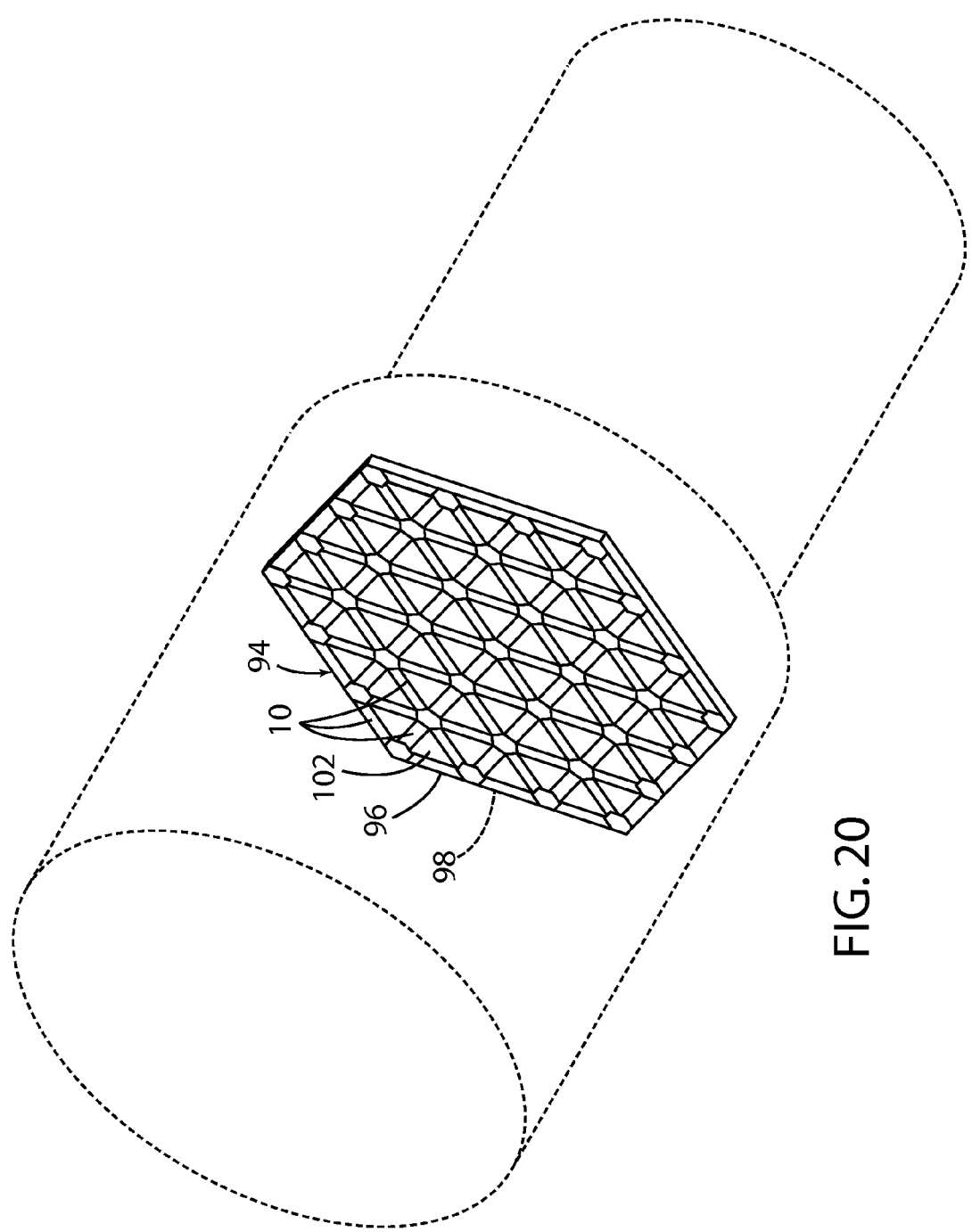
FIG. 20 is a perspective view of an active composite reflector including self-latching shape memory actuators according to another aspect of the present invention.

With further reference to FIG. 20, a composite reflector 94 according to another aspect of the present invention includes a curved primary structure 96 that is fabricated from carbon fiber or other composite materials. A front reflective/mirror surface 98 of primary structure 96 is concave to provide predefined optical reflective properties (e.g. magnification). The reflector 94 may be utilized for space-based optical systems. For example, the composite reflector 94 may be utilized in a spacecraft 95 as a component of a telescope.

The composite reflector 94 includes a plurality of self-latching piezocomposite actuators 10 that are disposed on a rear surface 102 of primary structure 96. Actuators 10 may be adhesively bonded to rear surface 102, or they may be integrally formed with the composite materials of the primary structure 96. In the illustrated example, actuators 10 extend between junctions 104 to form a hexagonal pattern. However, the actuators 10 may be oriented in any suitable configuration. The actuators 10 may be operably connected to a power source and a controller (not shown) whereby the shape of the front surface 98 is changed/controlled by the actuators 10. The actuators 10 thereby compensate for distortions in front surface 98 due to thermal effects, stress, or other environmental influences. The actuators 10 may also be utilized to compensate for imperfections in front surface 98 that may occur as a result of the fabrication process utilized to form main structure 96.

Figure 21:
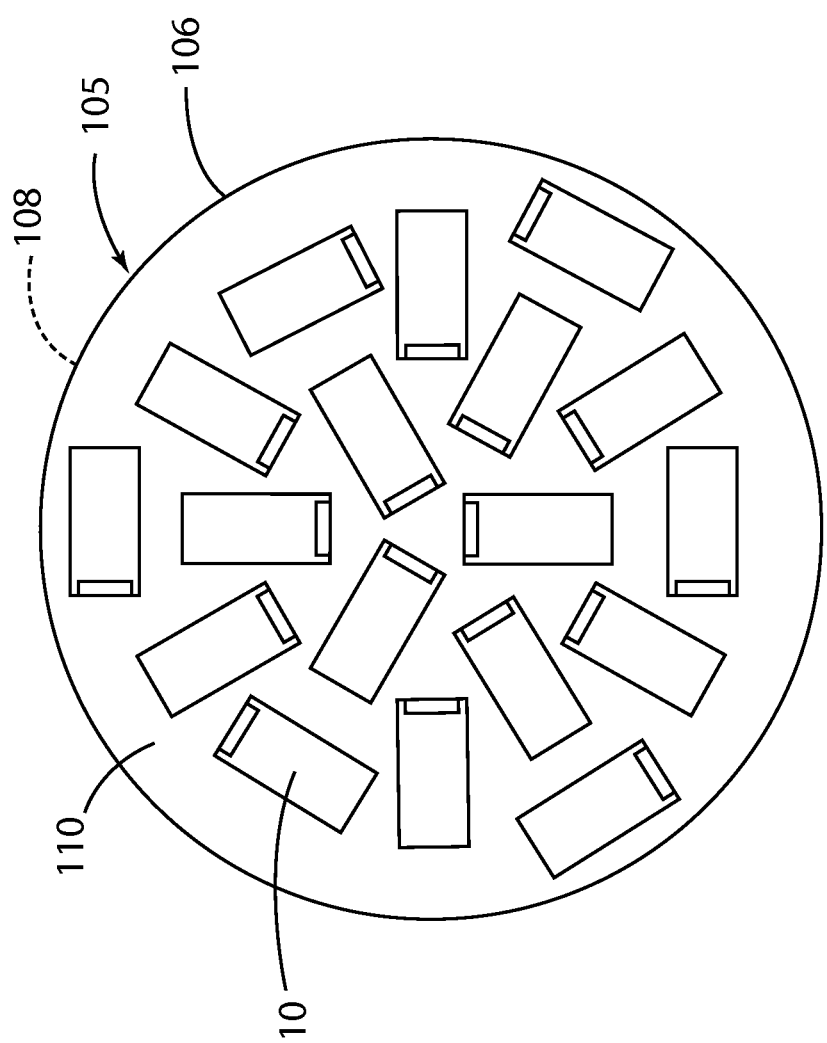
FIG. 21 is a perspective view of a solid reflector having a plurality of self-latching piezocomposite actuators according to another aspect of the present invention.

With further reference to FIG. 21 an optical reflector 105 according to another aspect of the present invention comprises a main body 106 that is generally disc-shaped, and forms a reflective front surface 108. The body 106 may comprise glass, ceramic, or other material, and the reflective front surface 108 may be coated with a reflective metal material or the like to form an optical mirror. A plurality of self-latching piezocomposite actuators 10 are disposed on rear surface 110 of body 106. Actuators 10 may be operably connected to an electrical power source (not shown) by wires or other suitable conductors not shown), and a controller (not shown) may be utilized to control the electrical power supplied to the actuators 10. One or more of the actuators 10 may be actuated to generate a force acting on the body 106 to thereby change the shape of reflective front surface 108. In this way, distortions in the front surface 108 due to thermal effects, applied loads, or other environmental factors can be actively corrected utilizing the actuators 10.

The reflector 94 and reflector 105 of FIGS. 20 and 21, respectively, may be controlled utilizing open loop or closed loop control systems. For example, sensors may be utilized to measure the shape of the reflective surfaces, and the actuators 10 may be selectively actuated to compensate for the measured distortions in the reflective surfaces. Alternatively, empirical data and/or analytical calculations may be utilized to predict the shapes of the reflective surfaces under various thermal and other environmental conditions. The temperature can then be measured or estimated, and the actuators 10 can be actuated as required to compensate for the estimated distortions in the reflective surfaces.

The invention claimed is:

1. A method of controlling a self-latching piezocomposite actuator having a layer of shape memory ceramic fibers and first and second layers including conductive patterns disposed on opposite sides of the layer of shape memory ceramic fibers, the method comprising:
causing the layer of shape memory ceramic fibers to have a first strain state by at least partially poling the layer of shape memory ceramic fibers utilizing a first electric field that is induced by causing a voltage difference in the conductive patterns of the first and second layers;
followed by removing the voltage difference whereby the shape memory ceramic fibers remain in the first strain state;
followed by at least partially depoling the shape memory ceramic fibers utilizing a second electric field having a polarity that is substantially opposite a polarity of the first electric field to thereby cause the shape memory ceramic fibers to have a second strain state that is not equal to the first strain state; and
wherein the shape memory ceramic fibers remain in the second strain state after the electric field is removed.

2. The method of claim 1, wherein:
the shape memory ceramic fibers are fully poled in the first strain state.

3. The method of claim 2, wherein:
the shape memory ceramic fibers are completely depoled in the second strain state.

4. The method of claim 3, including:
determining a present strain state of the shape memory ceramic fibers;
determining a required intermediate strain state between the first and second states; and
causing the shape memory ceramic fibers to change from the present strain state to the required intermediate strain state by applying an electric field to the shape memory ceramic fibers.

5. The method of claim 1, wherein:
the self-latching piezocomposite actuator defines a first curvature corresponding to the first strain state, and a second curvature that is not equal to the first curvature corresponding to the second strain state.

6. The method of claim 1, wherein:
the piezocomposite actuator is operably coupled to a structure that is capable of changing shapes;
determining a desired change in shape of the structure;
temporarily applying an electrical field to the shape memory ceramic fibers to change the strain state of the piezocomposite actuator to cause the desired change in shape of the structure from a first shape to a second shape; and
wherein the structure maintains the second shape after the electric field is removed.

7. The method of claim 6, wherein:
the structure comprises an airfoil and the first and second shapes define first and second cambers, respectively; and
the desired change in shape is determined, at least in part, on at least one of a desired lift and drag of the airfoil.

8. The method of claim 6, wherein:
the structure comprises a reflector having a concave reflective surface defining the first and second shapes; and
determining the desired change in shape is determined based on a desired change in optical properties of the concave reflective surface.

9. The self-latching structure of claim 1, wherein:
the shape memory ceramic fibers comprise a PZT-5H material.

10. A method of controlling the shape of a structure capable of defining at least first and second shapes, the method comprising:
providing a self-latching piezocomposite actuator comprising a plurality of aligned shape memory ceramic fibers defining first and second strain states;
operably connecting the self-latching piezocomposite actuator to the structure;
changing the strain state of the shape memory ceramic fibers from the first strain state to a second strain state by applying a first electrical field to the shape memory ceramic fibers such that the shape of the structure changes from the first shape to the second shape;
removing the first electrical field after the fibers are in the second strain state, wherein the actuator continues to maintain the structure in the second shape after the first electrical field is removed;
applying a second electrical field to the shape memory ceramic fibers to cause the shape memory ceramic fibers to change from the second strain state to a third strain state that is between the first and second strain states or equal to the first strain state, and wherein the structure defines a third shape corresponding to the third strain state that is between the first and second shapes or the same as the first shape, wherein the second electrical field has a reverse polarity relative to the first electric field;
maintaining the structure in the third shape by removing the second electrical field to maintain the shape memory ceramic fibers of the actuator in the third strain state.

11. The method of claim 10, including:
applying one or more electric fields to the fibers to control poling and depoling of the shape memory ceramic fibers to provide a predefined strain state between the first and second strain states.

12. The method of claim 10, including:
utilizing one or more sensors to determine an existing shape of the structure;
determining a required shape of the structure;
applying an electric field to change the strain state of the fibers to a strain state that results in the structure changing to the required shape from the existing shape.

13. The method of claim 10, wherein:
the fibers comprise an 8/65/35 PLZT material.

14. The method of claim 10, wherein:
the structure comprises an aircraft wing having a layer of flexible material defining an aerodynamic surface; and including:
actuating the actuator to control at least one of lift and drag by changing the shape of the flexible material.

15. The method of claim 10, wherein:
the structure includes a first portion and a control surface movably connected to the first portion; and including:
actuating the actuator to control the position of the control surface relative to the first portion.

16. The method of claim 10, wherein:
the structure comprises an inlet to an aircraft engine having a layer of flexible material defining an aerodynamic surface; and including:
actuating the actuator to control the shape of the inlet by changing the shape of the flexible material.

17. The method of claim 10, wherein:
the structure comprises a mirror defining a reflective surface; and including:
actuating the actuator to control the shape of the reflective surface.

18. A method of controlling a self-latching piezocomposite actuator, the method comprising:
providing a self-latching piezocomposite actuator comprising a plurality of aligned shape memory ceramic fibers defining first and second strain states and a plurality of intermediate strain states between the first and second strain states;
determining a required intermediate strain state of the shape memory ceramic fibers corresponding to a required shape of a structure incorporating the actuator;
determining a present strain state of the shape memory ceramic fibers;
changing the strain state of the shape memory ceramic fibers from the present strain state to the required intermediate strain state by applying an electrical field to the shape memory ceramic fibers;
removing the electrical field after the fibers are in the required strain state, and wherein the shape memory ceramic fibers remain in the required strain state.

19. The method of claim 18, including:
causing the shape memory ceramic fibers to change from the required strain state to the first strain state by applying a reverse polarity electrical field to the shape memory ceramic fibers.

20. The method of claim 18, including:
sensing a present shape of a structure;
determining a required shape of the structure;
determining a required strain state corresponding to the required shape of the structure; and
causing the shape memory ceramic fibers to change from the present strain state to the required strain state by applying an electrical field to the shape memory ceramic fibers.

* * * * *